(12) United States Patent
Northcutt et al.

(10) Patent No.: US 6,278,867 B1
(45) Date of Patent: Aug. 21, 2001

(54) METHODS AND SYSTEMS FOR FREQUENCY GENERATION FOR WIRELESS DEVICES

(75) Inventors: John W. Northcutt, Chapel Hill; Paul Wilkinson Dent, Pittsboro; Eric Alan Shull, Raleigh, all of NC (US); Harvey Zien, San Diego, CA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/200,051

(22) Filed: Nov. 25, 1998

(51) Int. Cl.[7] ................. H04B 1/06; H04B 7/00
(52) U.S. Cl. ............. 455/255; 455/256; 455/257; 455/258; 455/259; 455/264; 455/265; 455/180.3; 331/16; 331/17
(58) Field of Search .................. 455/113, 115, 455/125, 180.3, 255, 256, 257, 258, 260, 264, 265; 331/17, 57, 16

(56) References Cited

U.S. PATENT DOCUMENTS

| 4,450,587 | 5/1984 | Beyers, Jr. ............ 455/182 |
| 4,683,445 | * 7/1987 | Erickson ............ 331/17 |
| 4,921,467 | * 5/1990 | Lax ............ 455/264 |
| 5,048,059 | 9/1991 | Dent ............ 375/94 |
| 5,084,669 | 1/1992 | Dent ............ 324/83 D |
| 5,093,848 | 3/1992 | Raith ............ 375/97 |
| 5,136,616 | 8/1992 | Dent ............ 375/94 |
| 5,148,373 | 9/1992 | Dent ............ 364/484 |
| 5,214,702 | 5/1993 | Fischer ............ 380/30 |
| 5,220,275 | 6/1993 | Holmquist ............ 324/76.82 |
| 5,384,550 | * 1/1995 | Henely et al. ............ 331/17 |
| 5,475,705 | 12/1995 | Dent ............ 375/333 |
| 5,535,432 | 7/1996 | Dent ............ 455/77 |
| 5,604,468 | * 2/1997 | Gillig ............ 455/260 |
| 5,659,884 | * 8/1997 | Daughtry, Jr. et al. ............ 455/115 |
| 5,740,525 | * 4/1998 | Spears ............ 455/259 |
| 6,061,575 | * 5/2000 | Lombardi ............ 455/552 |
| 6,125,268 | * 9/2000 | Boesch et al. ............ 455/168.1 |

FOREIGN PATENT DOCUMENTS

| 0 560 475 | 9/1993 | (EP) . |
| 2286301A | 8/1995 | (GB) ............ H03J/7/02 |
| WO 90/16113 | 12/1990 | (WO) . |

OTHER PUBLICATIONS

Copy of PCT Search Report for corresponding application PCT/US99/22035.

* cited by examiner

Primary Examiner—Dwayne Bost
(74) Attorney, Agent, or Firm—Myers Bigel Sibley & Sajovec (57) ABSTRACT

Methods and systems are provided for frequency generation suitable for use in wireless devices capable of operating at multiple frequencies. Such systems may change the loop gain of an automatic frequency control loop based on the operating frequency of the wireless device. Furthermore, such a frequency dependent loop gain may be carried out by the selection of subroutines with differing loop gains associated with the subroutines. Furthermore, the loop gain may also be temperature compensated based on the temperature of the wireless device and/or the operating frequency of the device.

44 Claims, 4 Drawing Sheets

METHODS AND SYSTEMS FOR FREQUENCY GENERATION FOR WIRELESS DEVICES

FIELD OF THE INVENTION

The present invention relates generally to wireless devices and more particularly, to the generation of local frequencies by the wireless devices.

BACKGROUND OF THE INVENTION

In conventional wireless devices such as radiotelephones, it is often necessary to generate a local frequency for use as a fundamental frequency reference for the radiotelephone. One example of the use of local frequencies is seen in a dual mode radiotelephone, such as a radiotelephone which operates in the 800 MHz frequency range for cellular services and in the 1900 MHz range for personal communication services (PCS). In such a radiotelephone, the cellular and PCS bands are divided into a plurality of narrow bandwidth channels, such as 30 KHz wide channels for D-AMPS, 200 KHz channels for GSM or 1.8 MHz channels for CDMA. Such a radiotelephone typically generates a local frequency to be used by transceivers in the radiotelephone to modulate and demodulate signals in these frequency ranges. Accordingly, the frequency accuracy of the radiotelephone should be smaller than the channel spacing. Furthermore, for digital transmission, the frequency accuracy typically must be a small fraction of the information transmission rate, irrespective of the width of the channel. For example, even though an IS95 device may operate with 1.8 MHz channel spacing, a frequency accuracy of 100 Hz may be required.

To obtain these high accuracies, for example, 100 Hz at a carrier frequency of 2 GHz, an accuracy of 5 parts in 10 to the power of 8 may be necessary. Such an accuracy is greater than typically can be achieved by an open loop crystal oscillator. Thus, closed loop synchronization is typically utilized to increase frequency accuracy.

A closed loop system is typically implemented using a voltage controlled oscillator. The local frequency is generated by the voltage controlled oscillator and is synchronized to a frequency transmitted by a base station communicating with the wireless device. Thus, for example, in a conventional radiotelephone, a cellular base station transmits a synchronizing frequency which is received by the radiotelephone and compared to the locally generated frequency. The error between the synchronizing signal and the generated frequency is then typically used to adjust the control voltage to the voltage controlled oscillator to reduce the error between the two signals.

One problem with conventional voltage controlled oscillators is that, typically, the relationship between voltage and frequency may vary with temperature. Furthermore, the variation in frequency may change over time, thereby reducing the likelihood that a single temperature compensation would be suitable for the operational lifetime of the radiotelephone.

A further problem may arise from inaccuracies in the frequencies transmitted by base stations. Older base stations may provide inaccurate frequencies or the radiotelephone may have such a great initial error that a base station signal cannot be detected. Thus, it may not be practical to utilize synchronization with a base station at a given temperature to determine a temperature compensation value for a voltage controlled oscillator because the error in the signal may reflect variance in the synchronizing signal rather than the temperature variation in the voltage controlled oscillator. Conventional radiotelephones might have used averaging of compensation values across multiple base stations so as to reduce the impact of a few inaccurate base stations. The radiotelephone would then learn over time the temperature variations of the voltage controlled oscillator to compensate for such variations. Conventional radiotelephones can also, however, suffer temperature variations in the control sensitivity of their voltage controlled reference oscillators, which were typically not compensated in the prior art.

A further difficulty which may arise in dual band radiotelephones may result from the different operating frequencies of the radiotelephone. The damping factor and gain of the feedback control of the synchronizer circuit of the radiotelephone affect the minimal frequency error or the rate at which the voltage controlled oscillator reaches the synchronized frequency. As a result of the voltage controlled oscillator switching between two frequencies, the gain or damping factor of the feedback in the synchronization circuit of the radiotelephone may change thus, possibly, resulting in less than optimal performance for one or both of the frequencies.

SUMMARY OF THE INVENTION

In view of the above discussion, it is an object of the present invention to provide accurate local reference frequencies.

A further object of the present invention is to provide temperature compensation for voltage controlled oscillators to provide an accurate reference frequency upon initial switch-on before a signal is received.

Still another object of the present invention is to provide consistent performance of an automatic reference frequency adjustment system (AFC) over multiple frequencies and at various operating temperatures.

A further object of the present invention is to provide temperature and loop gain control for a synchronizing circuit which may be utilized with conventional radiotelephones.

These and other objects of the present invention are provided by methods and systems which provide frequency generation suitable for use in wireless devices capable of operating at multiple frequencies. Such systems may change the loop gain of an automatic frequency control loop based on the operating frequency of the wireless device. Furthermore, such a frequency dependent loop gain may be carried out by the selection of subroutines with differing loop gains associated with the subroutines. Furthermore, the loop gain may also be temperature compensated based on the temperature of the wireless device and/or the operating frequency of the device.

In a first embodiment of the present invention, a voltage controlled oscillator which provides a local reference frequency in a wireless device which operates using at least two frequency bands is synchronized to a received reference frequency by determining the frequency band of operation of the wireless device and adjusting a loop gain value based on the determined frequency band of operation of the wireless device. A control voltage is provided to the voltage controlled oscillator based on the determined frequency band of operation of the wireless device so as to provide a frequency adjusted local reference frequency and the control voltage revised based on an error associated with the frequency adjusted local reference frequency, based on the received reference frequency and based on the adjusted loop gain.

In a further embodiment of the present invention, the loop gain is compensated based on an operating temperature of the wireless device. In particular, the operating temperature of the wireless device is determined and a loop gain compensating value obtained from a table of temperature compensation values containing multiplier values selected so as to maintain substantially constant loop gain with variation in temperature. The loop gain is then compensated utilizing the obtained loop gain compensating value.

In another embodiment of the present invention, a change in sign of the error associated with the frequency adjusted local reference frequency is detected and the loop gain value changed if a change in the sign of the error is detected. Preferably, the loop gain decreases by a factor of two. Further, the loop gain may be decreased until a minimum loop gain value is reached. Such a minimum loop gain value is preferably based on the determined operating frequency.

In a particular embodiment of the present invention, the revision of the control voltage is carried out by a subroutine stored in a memory at a location associated with an interrupt vector. When a change in sign of the error associated with the frequency adjusted local reference frequency is detected, the location associated with the interrupt vector to is changed to a memory location associated with a subroutine utilizing a decreased loop gain. A plurality of subroutines may also be provided for each operating frequency. In such a case, the location associated with the interrupt vector is revised utilizing the memory locations associated with the plurality of subroutines for the operating frequency of the wireless device.

In another embodiment of the present invention, a plurality of subroutines are provided for the at least two operating frequencies. In such a case, parameters of the subroutines may be adjusted based on the determined operating frequency of the wireless device. In particular, the subroutine parameters may be adjusted by multiplying a loop gain of a subroutine by a ratio of the at least two operating frequencies.

In still another embodiment of the present invention, the control voltage is increased to provide an initial control voltage greater than the control voltage corresponding to the operating frequency.

In a further embodiment of the present invention, a local reference frequency in a wireless device is temperature compensated and synchronized to a received reference frequency by providing a table of temperature compensation values which compensate the local reference frequency for temperature. The initial values of the table may be factory preset. The temperature compensation values also have associated with them an indicator of accuracy. The temperature of the wireless device is measured and used with the table of temperature compensation values to adjust the initial frequency of the wireless device. Using this initial frequency adjustment, a signal is received and based on the received signal as a frequency reference, the frequency of the wireless device is further adjusted. The mean frequency adjustment of the local reference frequency is determined and a received accuracy indicator associated with the received reference frequency is also determined. The received accuracy indicator is compared with the indicator of accuracy associated with the temperature compensation value associated with the temperature of the wireless device so as to provide a relative accuracy comparison. The table of temperature compensation values may then by updated based on the relative accuracy comparison.

In another embodiment, the table of temperature compensation values is not updated if the relative accuracy comparison indicates that the received accuracy indicator is inferior to the indicator of accuracy associated with the temperature compensation value associated with the temperature of the wireless device. The table of temperature compensation values is, however, updated with the determined mean frequency adjustment if the relative accuracy comparison indicates that the received accuracy indicator is superior to the indicator of accuracy associated with the temperature compensation value associated with the temperature of the wireless device. The indicator of accuracy associated with the updated temperature compensation value may then also be updated with the received accuracy indicator. The table of temperature compensation values may also be updated by adjusting the temperature compensation value towards the determined mean frequency adjustment if the relative accuracy comparison indicates that the received accuracy indicator is equivalent or superior to the indicator of accuracy associated with the updated temperature compensation value associated with the temperature of the wireless device. Finally, the table of temperature compensation values is not updated if the mean frequency adjustment exceeds a threshold value associated with the received reference frequency of if the received signal is not correctly decodable.

In another embodiment of the present invention, frequency lock in a wireless device is accelerated when a hand over from a first base station operating at a first frequency to a second base station operating at a second frequency occurs by selecting a high initial loop gain of an automatic frequency control loop associated with a voltage controlled oscillator of the wireless device, wherein the voltage controlled oscillator provides a local reference frequency for the wireless device. The frequency error between the local reference frequency generated is measured utilizing the received reference frequency from the second base station and used to adjust the local reference frequency using a high initial loop gain. Sign changes of the measured frequency error are detected and the loop gain of the automatic frequency control loop decreased responsive to detected changes in sign until a minimum loop gain associated with the second frequency of operation of the second base station is achieved. The minimum loop gain associated with the second frequency of operation is different from the minimum loop gain associated with the first frequency of operation when the second base station transmits in a different frequency band from that used by the first base station.

In such an embodiment, the loop gain may be progressively reduced by providing a set of predefined loop gains and selecting the next lower loop gain in the set of predefined loop gains when a sign change is detected. Furthermore, where each of the set of predefined loop gains has associated with it a subroutine, the next lower loop gain may be selected by selecting the subroutine associated with the next lower loop gain. Also, the predefined set of loop gains preferably comprises loop gains which decrease by a factor of two.

As will be appreciated by those of skill in the art, the present invention may be provided as systems or methods, including radiotelephones which incorporate such systems or methods.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices. Accordingly, the present invention may take the form of an entirely hardware embodiment, an entirely software embodiment or an embodiment combining software and hardware aspects.

Figure 1:
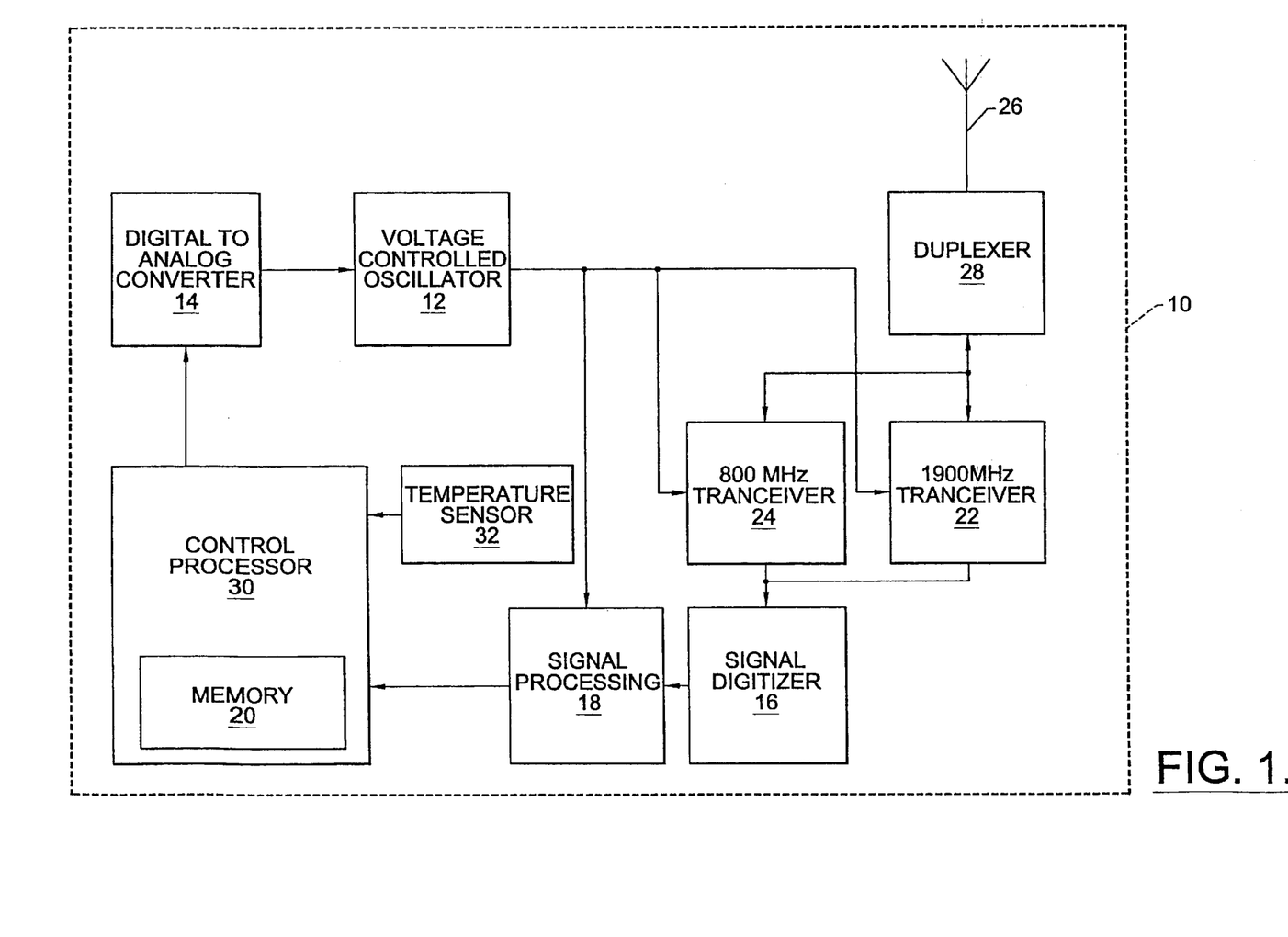
FIG. 1 is a block diagram of a radiotelephone suitable for use with the present invention.

An embodiment of a dual mode radiotelephone 10 which incorporates the temperature compensated local frequency generation according to the present invention is illustrated in FIG. 1. As seen in FIG. 1, the radiotelephone 10 includes a voltage controlled oscillator (VCO) 12. The frequency of the output of the VCO 12 is dependent on an input voltage. The input voltage in the radiotelephone 10 illustrated in FIG. 1 is provided by digital to analog converter (DAC) 14. DAC 14 receives a digital input value from control processor 30 and converts this digital value to an analog voltage level which is provided to VCO 12 to control the output frequency of VCO 12.

As is further illustrated in FIG. 1, the VCO output is provided to the dual mode transceivers, 22 and 24. Transceiver 22 may be utilized by radiotelephone 10 when operating in 1900 MHz mode and transceiver 24 utilized when operating in 800 MHz mode. Transceivers 22 and 24 may also be a single, dual-band transceiver. The antenna structure 26 of radiotelephone 10 may be used to both transmit and receive signals to and from a base station. The antenna structure 26 may be connected to the transceivers, 22 and 24, through a duplexer 28. Conventional transceivers 22 and 24 as well as antenna structures 26 and duplexers 28 may be utilized in a radiotelephone incorporating the present invention. Accordingly, as these aspects of the radiotelephone 10 are well known to those of skill in the art, no further discussion will be provided herein.

The radiotelephone 10 of FIG. 1 also includes a signal digitizer 16 and signal processing 18. The digitizer 16 receives the synchronizing frequency signal transmitted by the base station and provides a digital representation of the synchronizing frequency signal to the signal processing 18. The signal processing 18 receives the digital information from the digitizer 16 and provides a frequency error estimate to the control processor 30. The control processor 30 receives the error estimate and utilizes the error estimate and information stored in a memory 20 associated with the control processor 30 to provide a revised digital value to the D/A 14 so as to control the frequency of the output of the VCO 12 in such a way as to minimize future error estimates.

In one embodiment, the digitizer 16 can comprise a phase digitizer and an amplitude (Received Signal Strength Indicator, "RSSI") digitizer as disclosed in U.S. Pat. No. 5,048,059 entitled "Logpolar Signal Processing," the disclosure of which is incorporated herein by reference as if set forth fully herein. In another embodiment, the digitizer 16 can comprise a Cartesian signal digitizer which digitizers in-phase and quadrature vector components of the received signal. Such a Cartesian signal digitizer is described in U.S. Pat. No. 5,214,702 entitled "DC Offset Compensation in A Radio Receiver", which is hereby incorporated by reference herein. U.S. Pat. No. 5,084,669 entitled "Direct Phase Digitization," U.S. Pat. No. 5,148,373 entitled "Method and an Arrangement for Accurate Digital Determination of the Time or Phase Position of a Signal Pulse Train" and U.S. Pat. No. 5,220,275 entitled "Accumulator Phase Digitizer," the disclosures of which are incorporated by reference as if set forth fully herein describe methods for implementing the phased digitizer, if used. Whether Logpolar or Cartesian digitization is used, it is known that one form can be converted to the other and vice versa, depending on which is more convenient for subsequent processing.

The digitized signal may be processed in a number of ways to decode information as well as for determining a frequency error value. For example, if the signal being processed is an AMPS analog control channel signal, it may be processed as described in U.S. Pat. No. 5,475,705 entitled "Demodulator for Manchester-coded FM Signals," the disclosure of which is incorporated by reference as if set forth fully herein. Alternatively, if the signal is a digitally-modulated signal to be processed by a Maximum Likelihood Sequence Estimator, the processing may be as described in U.S. Pat. No. 5,093,848 entitled "Method of Controlling the Frequency of a Coherent Radio Receiver and Apparatus for Carrying Out the Method," or U.S. Pat. No. 5,136,616 entitled "Method of Rapidly Controlling the Frequency of a Coherent Radio Receiver and Apparatus for Carrying Out the Method," the disclosures of which are incorporated by reference as if set forth fully herein. Using any such method, the determined frequency error of the received signal relative to the receiver's own reference oscillator is periodically supplied to processor 30 which then implements the inventive methods described herein for controlling the voltage controlled oscillator 12. One objective of the present invention is to store the parameters needed to control oscillator 12 to an accurate frequency in memory 20, which can be a non-volatile memory type known as EEPROM. The stored control signals can be stored against a list of temperature values measured by temperature sensor 32 so as to form a temperature compensating table that improves in accuracy with use of the wireless device and compensates for aging drift. Thus, after a period of use the use of a temperature-addressed control value will provide a high initial frequency accuracy even before detecting a base station signal, thereby speeding the detection of such signals.

In particular, the control processor 30 may initially have stored in memory 20 a table of initial temperature compensation values. Preferably this table is initiated by storing temperature compensation values and an indicator of accuracy associated with each temperature compensation value at the factory. The indicator of accuracy would indicate how accurately the temperature compensation value was determined. For example, the indicator of accuracy could indicate if the temperature compensation value was determined based on an analog base station signal, such as AMPS, having about ±1 kHz accuracy, a digital base station signal, such as GSM, having a ±100 Hz accuracy, or the factory preset value of about ±10 kHz accuracy. The factory established temperature compensation values would be utilized by the control processor 30 as initial temperature compensation values in compensating for temperature changes of the radiotelephone. To avoid individually compensating each radiotelephone using an oven, which takes too long, only a mean temperature compensating table may be installed. The control processor 30 would also have available the temperature of the telephone from a temperature sensor 32. Thus, the control processor 30 may read the temperature from the temperature sensor 32 and look up the corresponding temperature compensation value from the look-up table stored in memory 20.

In addition to having access to memory 20, the control processor 30 is also preferably capable of interrupt driven operation. Thus, when an interrupt is signaled to the processor, the processor begins execution at a location in memory associated with the signaled interrupt. This location in memory may be referred to as an interrupt vector. Furthermore, interrupt vectors for different interrupts of the control processor 30 may be stored in memory in what may be referred to as an interrupt vector table. The values of the interrupt vectors in the interrupt vector table preferably may be changed so that the location in memory associated with an interrupt may be altered.

In the radiotelephone 10 in FIG. 1, the signal processing 18 preferably signals an interrupt (the Automatic Frequency Control (AFC) interrupt) to the control processor 30 when an error estimate is generated. Thus, the AFC interrupt may be generated with a periodicity at which new frequency measurements are made. For example, in TDMA, the periodicity may be the 20 ms frame period for D-AMPS, the 4.6 ms frame period for PCS1900/GSM, the 20 ms frame period of IS95 or the 43.6 mS frame period of AMPS. Furthermore, a frequency error measurement may be considered valid such that a new VCO voltage would be generated only if valid data is detected, such as upon an indication of valid data from demodulated data being error correction decoded, a cyclic redundancy code check or other such indicator of valid data. Alternatively, the Digital Voice Color Code (DVCC) could be utilized such that frequency error information would be considered valid if the DVCC decodes to an expected value.

When the AFC interrupt is activated, the control processor 30 begins execution of the instructions located in memory 20 at the associated interrupt vector. When these instructions have been completed, processing continues with the instructions executing in the control processor 30 before the interrupt was received. Accordingly, the control of the digital value provided the DAC 14 to control the VCO 12 may be provided as an interrupt subroutine executing in control processor 30 when an AFC interrupt is signaled.

As will be appreciated by those of skill in the art, while the present invention will be described as the signal processing 18 activating the AFC interrupt, other sources for the AFC interrupt may also be provided. For example, the interrupt may be activated by the control processor 30 upon, for example, detection of a change in the operating mode of radiotelephone 10 from 800 MHz to 1900 MHz. Thus, the present invention should not be construed as limited to any particular method of activating the AFC interrupt.

Furthermore, while the present invention is illustrated as having a single memory 20, as will be appreciated by those of skill in the art, wireless devices according to the present invention may have multiple memories or memories of differing types. For example, the interrupt subroutines executed when the AFC interrupt is activated may be stored in a nonvolatile memory such as programmable read only memory and the interrupt vector table stored in temporary memory such as random access memory. While the particular memory configuration is not critical to the present invention, as will be appreciated by those of skill in the art in light of the present invention, the present invention preferably is carried out using a memory configuration which allows changing the interrupt vector of an interrupt and which allows updating the temperature compensation values stored in memory.

Various aspects and embodiments of the present invention will now be described with respect to FIGS. 2 through 4 which are flowchart illustrations of embodiments of the present invention. It will be understood that each block of the flowchart illustrations, and combinations of blocks in the flowchart illustrations, can be implemented by computer program instructions. These program instructions may be provided to a processor, such as control processor 30, to produce a machine, such that the instructions which execute on the processor create means for implementing the functions specified in the flowchart block or blocks. The computer program instructions may be executed by a processor to cause a series of operational steps to be performed by the processor to produce a computer implemented process such that the instructions which execute on the processor provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based systems which perform the specified functions or steps, or combinations of special purpose hardware and computer instructions.

Figure 2:
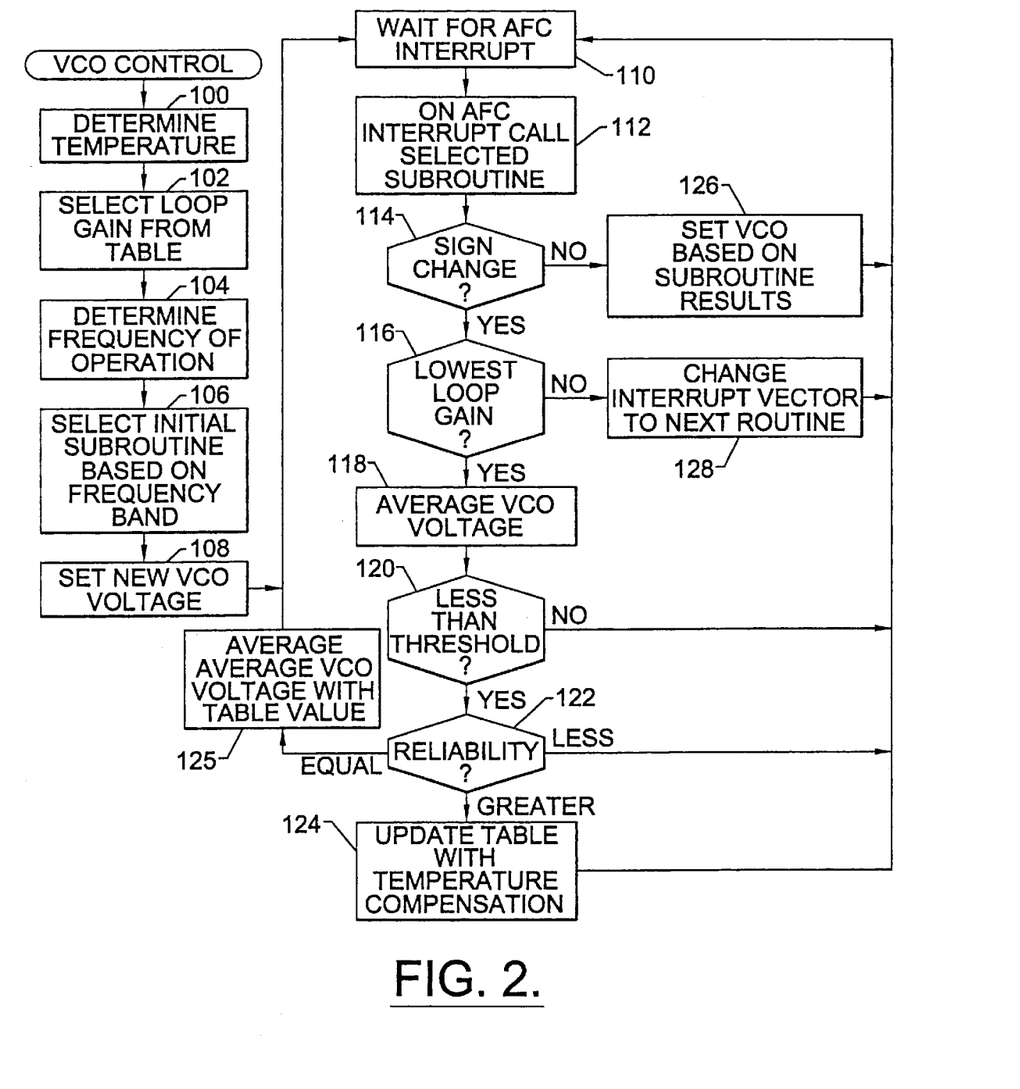
FIG. 2 is a flow chart illustrating operations of one embodiment of the present invention.

The operations for temperature compensated voltage control according to one embodiment of the present invention are illustrated in FIG. 2. Preferably, these operations are carried out as part of a subroutine or subroutines which are executed in response to activation of the AFC interrupt as described above. For example, the AFC interrupt could be activated when a transfer to a new base station occurs, when a change in operating frequencies occurs or upon awakening from a sleep or idle mode. Furthermore, a separate interrupt or interrupt vector could be utilized for different types of changes. For example, changing operating frequencies or switching base stations may cause an initial VCO value to be determined. In such a system, the AFC interrupt could be utilized for subsequent operations such as the feed back operations including evaluation of an error value generated by signal processing 18 to generate a new VCO voltage.

The Automatic Frequency Control (AFC) system is a feedback control system or closed loop that must have desirable characteristics of stability, fast transient response and provide filtering of the radio noise on the AFC error value. Any control loop should have at least one true integrator with infinite DC gain to ensure that the loop settles to zero static error in the mean. This integrator can be provided numerically within processor 30. The integrator comprises accumulating each new error measurement with the previous integrated value, such that a succession of errors of the same sign result in ever increasing integrator values, which are then used to derive the oscillator control voltage by outputting the integrator value to Digital-to-Analog converter 14.

In a preferred implementation, the frequency error is provided from signal processing 18 as an 8-bit byte. This error value is accumulated to the least significant byte (LSB) of a 16-bit (2-byte) integrator value. The most significant byte (MSB) of the integrator value is then output to an 8-bit digital to analog converter to generate the oscillator control voltage. Because the error is added to the LSB while the MSB is used for the control voltage, the error is subject to a gain factor of 1/256 in this mode, which attenuates noise on the measurement. However, in this low-loop band width mode, the automatic frequency control cannot respond sufficiently rapidly to a change from a low-accuracy, analog base station to a high-accuracy, digital base station. When this event occurs, the error value is instead left shifted by one or more bits before accumulating it with the integrator value, thus increasing the loop gain by some power of two. The increased loop gain may only be appropriate when performing the hand-over from the low accuracy to the high accuracy base station and preferably is not used permanently due to an increase in the noise that would be applied to the oscillator control voltage. Therefore, it is desired to reduce the loop gain back to the maintaining value as rapidly as possible upon achieving the desired frequency accuracy.

Denoting the AFC error byte supplied by digital signal processing 18 as DSPAFC and the 16-bit reference integrator value as REFINT, the normal loop gain regime requires the computation $$REFINT=REFINT+DSPAFC \text{ upon each AFC interrupt.} \quad (1)$$

During hand-over from an analog or low accuracy to a digital or high accuracy base station, higher loop gain values are provided by performing the calculations:

$$REFINT=REFINT+2*DSPAFC \quad (2)$$

$$REFINT=REFINT+4*DSPAFC \quad (3)$$

$$REFINT=REFTNT+8*DSPAFC \quad (4)$$

$$REFINT=REFINT+16*DSPAFC \quad (5)$$

instead for successively higher loop gains. Factors of two, 2,4,8 . . . etc are chosen to facilitate implementation by a simple right shift by one or more binary places instead of more complex multiply operations.

Simulations have shown that higher loop gains using a multiplication factor higher than 16 caused unduly oscillatory transient response, which required addition of a damping term. The formula for a 32 times increase in gain including the damping term used was $$REFINT=REFINT+32*(2*DSPAFC(I)-DSPAFC(I-1)) \quad (6)$$

This describes that integrator value REFINT shall be increased by 32 times the difference between twice the current error value DSPAFC(I) minus the previous error value DSPAFC(I-1).

Equations 1 through 6 represent five different loop gains modes which are selected in the following manner. Each is implemented within a small interrupt routine (routines 1 through 6 where each corresponds to equations 1 through 6 respectively) having a start address in memory. Upon detecting a handoff command from an analog to a digital base station, the AFC interrupt vector is set to point to the start address of routine 6, the fastest loop mode. Within that routine, there are also instructions to detect whether the error value DSPAFC(I) has changed sign compared to the previous value DSPAFC(I-1). If so, before exiting the interrupt routine, it changes the interrupt vector to point to routine 5, the next lowest loop gain value. Routine 5 also comprises instructions to detect a sign change between two successive AFC error values, and then to switch the interrupt vector to point to routine 4, and so on until, after five changes in the sign of the error, routine 1 is the AFC interrupt routine and would not, in the prior art, have been changed until an analog-digital hand-over was next encountered.

In a dual-band telephone for operation at both 800 MHz and 1900 MHz, however, the loop gain is also affected in the ratio 19/8 when switching from 800 to 1900 MHz. Therefore, routine 1, if optimum for 800 MHz, may be of too high loop gain for 1900 MHz. A new routine with a more optimum loop gain may be instead:

$$REFINT=REFINT+0.5*DSPAFC. \quad (7)$$

Moreover, the multiplying factor for which a damping term must be added may now be 16 instead of 32.

One implementation of the present invention, thus, comprises scaling the value DSPAFC in inverse proportion to the operating frequency before use in routines 1 through 6, thus maintaining constant loop gain irrespective of frequency or frequency band in use. Because digital signal processing 18 is more adept at multiplicative scaling than processor 30, this scaling can be performed in signal processing 18.

In a further implementation of the present invention, the loop gain is also compensated for temperature variation in the control sensitivity of the reference oscillator which is measured in Hz/Volt. Temperature compensating scaling factors are fetched in dependence on the temperature measured by temperature sensor 32 from the temperature compensating table in memory 20 and used to scale the DSPAFC value additionally.

In another embodiment, two sets of the 6 routines above are supplied, one set for 800 MHz operation and another set for 1900 MHz operation. Upon detecting a hand-over from a low accuracy base station to a high accuracy base station, the AFC interrupt vector is momentarily changed to point either to routine 6 for the 800 MHz case, if the high accuracy base station operates at an 800 MHz band, alternatively to the routine 6 that is optimized for 1900 MHz operation if that is the band in use by the new base station. In each case, following each successive sign change of the error value DSPAFC, the interrupt vector would be reset to point to the next lowest loop gain AFC routine for the same frequency band.

In addition to the numerical filtering of noise provided by the loop integrator REFINT, it can be desirable to filter out numerical quantizing noise from the digital to analog convertor 14 output by including a substantial RC time constant on the voltage controlled oscillator 12 voltage control line, of the order of 50 mS, thus making the feedback loop a second order loop. It can be shown that this loop is critically damped when the ratio of the integrator time constant to the RC time constant is 4:1. This must be slightly modified due to the 20 mS sampling. In practice, to avoid needing multiplications in the processor, the software integrator time constant may be chosen for ease of implementation and then the external RC time constant set to get the best response.

Because the digital to analog converter 14 accuracy is generally less than the 16-bit word length of the value REFINT, one refinement is to add the value REFINT to a holding register of 16 bits before outputting the value of the holding register to the digital to analog converter 14. Then, those most significant bits which are output to the digital to analog converter 14 are set to zero in the holding register, while the least significant bits, which could not be output this time, are left in the holding register to accumulate with the next value of REFINT added to the holding register. The least significant bits, therefore, accumulate in the holding register until a carry is caused to a more significant bit which does affect the digital to analog converter 14 output value, thus, preventing a cumulative error. It may even be advantageous to output the holding register to the digital to analog converter 14 in this way at a rate which is several times greater than the rate at which the value REFINT is updated, which has the effect of jittering the digital to analog converter 14 between two adjacent values at a rate which is smoothed out by the aforementioned RC time constant, thus, providing a mean oscillator control voltage that can lie between two quantizing steps of the digital to analog converter 14.

Returning to FIG. 2, the control processor 30 determines the temperature (block 100) and selects a loop gain from the stored loop gain table (block 102) based on the temperature. The frequency of operation is determined (block 104) and the initial subroutine selected based on the frequency band of the radiotelephone (block 106). The new VCO voltage is then set (block 108). When an AFC interrupt is received (block 110), the control processor 30 calls the selected subroutine by beginning execution at the memory address of the interrupt vector (block 112). The control processor 30 determines the new control voltage utilizing the subroutine and then determines if the error of the current frequency measurement is of an opposite sign to a previous error value for a previous frequency measurement, i.e. a zero cross over is detected in the frequency error (block 114). If it is determined that a sign change has not occurred, then the control processor 30 sets the VCO voltage based on the results of the execution of the subroutine (block 126). The control processor then waits for the next AFC interrupt (block 110). Because the subroutine or other instructions utilize the information about the previous error value in determining if a sign change has occurred, it is preferred that the subroutine store or otherwise maintain the value of the previous error determination or at least the sign of the previous error determination.

If a sign change is detected, then the control processor 30 determines if the current subroutine pointed to by the interrupt vector is the subroutine with the lowest loop gain for the operating frequency of the radiotelephone 10 (block 116). If the current subroutine is not the lowest loop gain subroutine, then the subroutine with the next lowest loop gain is selected (block 128). As described above, this selection may take the form of revising the interrupt vector to point to a new subroutine or by revising the current subroutine or the inputs or outputs of the subroutine to provide the next lowest loop gain. As is illustrated in FIG. 2, this process of lowering loop gain when a zero crossing is detected may be repeated until the lowest loop gain associated with the operating frequency is reached.

If the control processor 30 determines that the current subroutine is the lowest loop gain subroutine for the operating frequency for the radiotelephone 10, then the current frequency output of the VCO is assumed to be the final frequency based on the detection of a sign change at the lowest loop gain. In other words, when the feed back loop of the signal processing 18 and control processor 30 has reached steady state operation, an update temperature compensation value is determined based on the frequency error (block 118). This should be a long term average of the oscillator control voltage even averaged over a whole telephone call, since each temperature value is permitted to be updated only very infrequently. The values that are averaged are preferably only values that occur during periods when the telephone detects it is receiving error-free data.

After averaging the control voltage at each temperature indicated by sensor 32 during a call, it is then, optionally, determined if average value is within a threshold associated with the type of base station from which the reference frequency is received (block 120). If the average exceeds the threshold then it is discarded. If it is not discarded, then the accuracy indicator for each stored temperature point is greater than, less than or the same as the current base station's accuracy (block 122). If the accuracy of the current base station is less than the stored accuracy, then the updated temperature compensation value is discarded (block 122). However, if the current base station's indicator of accuracy is higher than the indicator of accuracy in the temperature compensation table, then the table is updated with the updated temperature compensation value and the indicator of accuracy associated with the base station of the current synchronizing frequency, i.e. the base station from which the updated temperature compensation value has been derived (block 124). If the current base station accuracy is equal to the current indicator of accuracy for the temperature then the stored compensation value is averaged with the new averaged control voltage by, for example, moving it fractionally from its current value towards, but not all the way to, the new value (block 125).

As will be appreciated by one of skill in the art, alternatively, the indicator of accuracy of the base station could be compared to the indicator of accuracy of the temperature compensation value and the determination of blocks 118 and 120 skipped if the indicator is less than the indicator of accuracy associated with the temperature compensation value. Furthermore, once a sufficiently accurate temperature compensation table has been developed, the learning function may be disabled or only intermittently applied to verify the accuracy of the temperature compensation table, for example, once per switch-on period.

As is seen from FIG. 2, the present invention provides for differing loop gains which may be specific to a particular operating frequency band. Thus, the tradeoff between speed and accuracy in arriving at a steady state frequency of the VCO may be optimized for each operating frequency band. Such a speed/accuracy tradeoff may be optimized by utilizing a rapid adjustment regime which initially has parameters such as loop gain and damping factor set to quickly reduce the frequency error and then reducing these parameters to obtain a greater resolution of measurement noise. Control parameters may be initially utilized which would, for example, provide a control voltage which would overshoot the final voltage so as to provide a rapid response to, for example, awakening from a sleep mode. This could be provided by increasing the control voltage to provided an initial control voltage greater than the control voltage corresponding to the operating frequency. The control voltage could then be more accurately determined in subsequent control voltage determinations.

By incorporating an indicator of accuracy associated with the temperature compensation values, values generated from less accurate sources may be discarded such that revisions to the temperature compensation values are only made from sources with at least as high a likelihood of accuracy as the current temperature compensation value. Thus, the accuracy of the temperature compensation value may be protected from corruption by less reliable signal sources.

Particular embodiments of the present invention will now be described with respect to FIGS. 3 and 4 which are flow chart illustrations of the operations of the present invention which allow for the use of frequency dependent loop gains. As will be appreciated by those of skill in the art, the operations of FIG. 2 relating to the determination of revised temperature compensation values and the storing of those values could be included in the operations of FIGS. 3 and 4.

Figure 3:
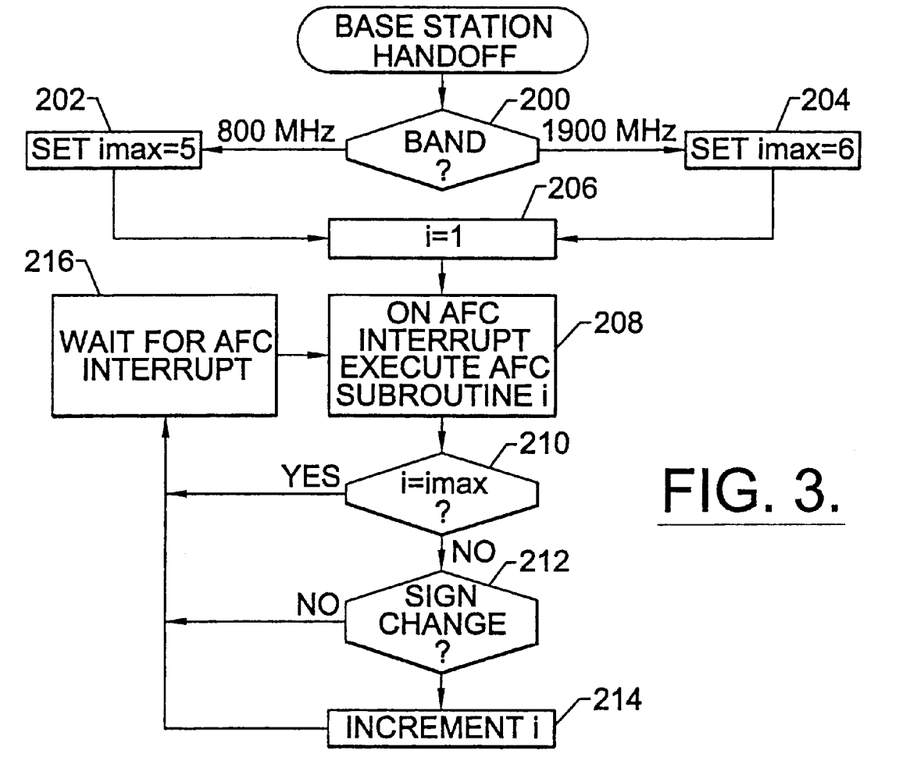
FIG. 3 is a flow chart illustrating operations of an alternative embodiment of the present invention.
Figure 4:
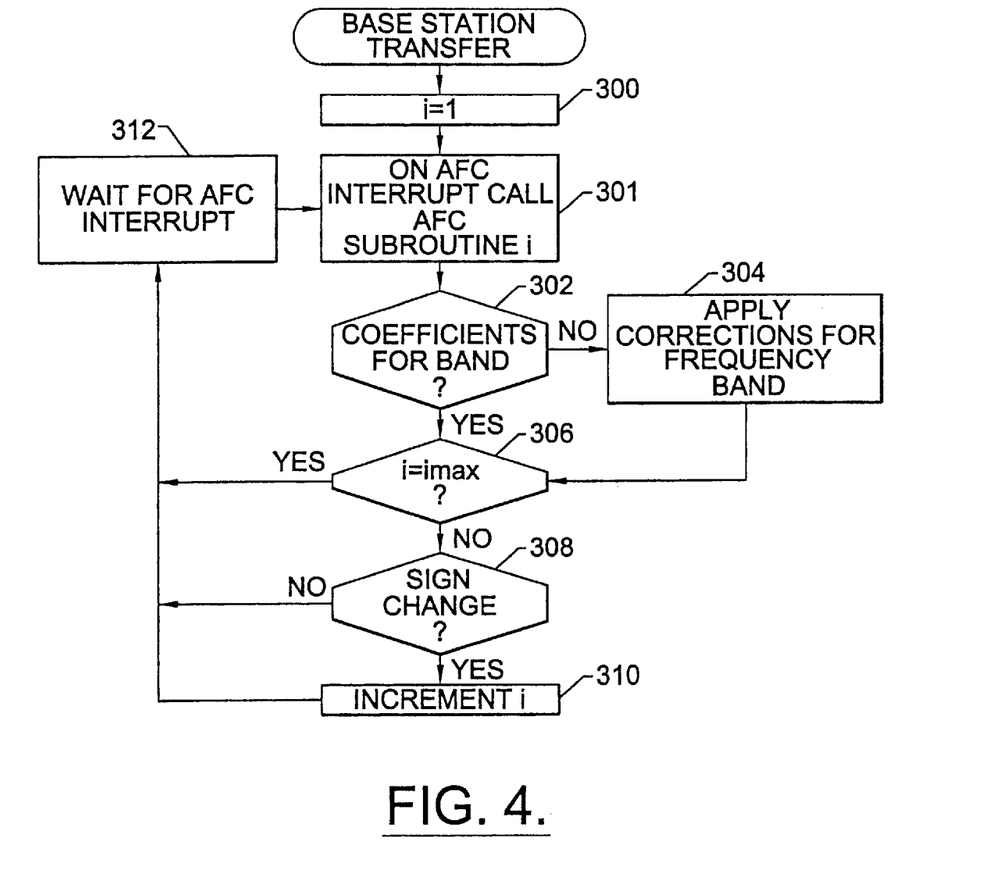
FIG. 4 is a flow chart illustrating operations of a second alternative embodiment of the present invention.

Thus, the operations of blocks 118 through 124 of FIG. 2 could be incorporated into FIGS. 3 and 4 after it is determined that the lowest loop gain for the particular operating frequency has been reached (block 210 of FIG. 3 and block 306 of FIG. 4) and before waiting for the next AFC interrupt (block 216 of FIG. 3 and block 312 of FIG. 4). However, for clarity, those operations have been omitted from FIGS. 3 and 4.

FIG. 3 describes an embodiment of the present invention where multiple subroutines with differing loop gains are stored in memory at differing memory locations. As illustrated in FIG. 3, the subroutines are identified as "Subroutine i" where i is an index value for the subroutine. In the example illustrated in FIG. 3, subroutines for i=1 to 5 are associated with operation at 800 MHz and subroutines for i=1 to 6 are associated with operations at 1900 MHz. Thus, common subroutines i=1 to 5 are utilized in both frequencies of operation and subroutine i=6 is only utilized in 1900 MHz operation. Preferably, the changes in loop gain result in the progressive reduction by a factor of 2 of the loop gain. The damping factor may also be varied by the techniques described with respect to Equation 6. Thus, in the example in FIG. 3, the steady state loop gain for 1900 MHz operation would be ½ the loop gain of steady state operation at 800 MHz because 1900 MHz operation utilizes one more subroutine than the 800 MHz operation.

The particular operations of control processor 30 are illustrated in FIG. 3 when a base station handoff occurs. As seen in FIG. 3, the control processor 30 determines which band of operation the radiotelephone 10 is utilizing (block 200). If 800 MHz operation is used then $i_{max}$ is set to 5. (block 202). If 1900 MHz operation is used then $i_{max}$ is set to 6. (block 204). The control processor then sets i to 1 and selects the subroutine corresponding to i=1 by setting the AFC interrupt vector to the starting address of subroutine 1 (block 206).

When the AFC interrupt is received, subroutine i is executed to obtain the new voltage value for the VCO 12 (block 208). The control processor then determines if $i_{max}$ has been reached (block 210). If $i_{max}$ has been reached (e.g. 5 for 800 MHz or 6 for 1900 MHz) then the control processor waits for the next AFC interrupt (block 216). However, if $i_{max}$ has not been reached, then the control processor determines if the frequency error from the current frequency measurement is of opposite sign to the error from a previous frequency measurement (i.e. a zero crossing) (block 212). If a sign change has not occurred then the control processor 30 waits for the next AFC interrupt without changing the subroutine utilized (block 216). However, if a sign change has occurred, then i is incremented to select the next subroutine and the interrupt vector for the AFC interrupt is changed to reflect the incremented i value (block 214). The control processor 30 then waits for the next AFC interrupt (block 216). Thus, the control processor 30 may successively reduce the loop gain until the minimum loop gain for the operating frequency is reached.

While the operations in FIG. 3 illustrate overlapping subroutines utilized by multiple operating frequencies, as will be appreciated by those of skill in the art, the subroutines utilized may be non-overlapping such that completely different subroutines are utilized for one frequency band than are utilized for a second frequency band of operation. Furthermore, any degree of overlap between subroutines may also be employed while still benefiting from the teachings of the present invention.

FIG. 4 illustrates an embodiment of the present invention where a single set of subroutines is utilized to determine VCO voltages. As seen in FIG. 4, the controller initially sets the subroutine to the first subroutine with the highest loop gain (i=1) (block 300). When an AFC interrupt occurs, the subroutine corresponding to i is selected and it is determined if the coefficients for the operating frequency band of the radiotelephone have been corrected for the subroutine (block 301 and block 302). If the coefficients have not been compensated for the operating frequency, then the controller determines corrected coefficients for the is operating frequency band (block 304). As described above, these corrections may be made by scaling the input or output parameters of the subroutine or by directly changing values used within the subroutine by, for example, passing parameters to the subroutine or modifying a commonly accessible memory location. Furthermore, the loop gain of a subroutine may be compensated by multiplying a base loop gain value by a ratio of operating frequencies of the radiotelephone. Thus, for example, if the loop gain has been optimized for 800 MHz operation, then to operate at the 1900 MHz frequency, the loop gain would be multiplied by 800/1900. Such a compensation may also be accomplished by multiplying the input error to the subroutines by this ratio or by multiplying the output by the ratio. Alternatively, the measured errors or control voltages could be doubled or halved for the differing operating frequencies.

In an alternative embodiment, the frequency measurements could be compensated directly by the signal processing 18 by multiplicative scaling as discussed above. Furthermore, it may also be beneficial to provide the operating frequency information to other portions of radiotelephone 10. For example, a demodulator or channel tracker (not illustrated) in the radiotelephone 10 may use the frequency information to modify the rate of change of fading which must be tracked so as to compensate for the speed of motion, which is wavelengths per second, and which is not the same at different frequencies. After correcting the parameters of the subroutine, the controller 30 then determines if $i=i_{max}$ (block 306) indicating that the lowest loop gain had been reached. If the lowest loop gain has been reached, then the controller 30 waits for the next AFC interrupt (block 312). However, if the lowest loop gain has not been reached, then the controller 30 determines if a sign change has occurred (block 308) as described above. If a sign change has occurred, then the controller 30 sets the subroutine to the subroutine with the next lower loop gain by incrementing i (block 310) and then waits for the next AFC interrupt (block 312).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of synchronizing a voltage controlled oscillator which provides a local reference frequency in a wireless device to a received reference frequency, wherein the wireless device operates in at least two frequency bands, the method comprising the steps of:

determining the frequency band of operation of the wireless device;

adjusting a loop gain value based on the determined frequency band of operation of the wireless device;

providing a control voltage to the voltage controlled oscillator based on the determined frequency band of operation of the wireless device so as to provide a frequency adjusted local reference frequency;

revising the control voltage provided to the voltage controlled oscillator based on an error associated with the frequency adjusted local reference frequency, based on the received reference frequency and based on the adjusted loop gain; and compensating the loop gain based on an operating temperature of the wireless device.

2. A method according to claim 1, wherein the step of compensating the loop gain comprises the steps of:

determining the operating temperature of the wireless device;

obtaining a loop gain compensating value from a table of temperature compensation values containing multiplier values selected so as to maintain substantially constant loop gain with variation in temperature; and compensating the loop gain utilizing the obtained loop gain compensating value.

3. A method according to claim 2, wherein the multiplier values are linearly decreasing with temperature.

4. A method of synchronizing a voltage controlled oscillator which provides a local reference frequency in a wireless device to a received reference frequency, wherein the wireless device operates in at least two frequency bands, the method comprising the steps of:

determining the frequency band of operation of the wireless device;

adjusting a loop gain value based on the determined frequency band of operation of the wireless device;

providing a control voltage to the voltage controlled oscillator based on the determined frequency band of operation of the wireless device so as to provide a frequency adjusted local reference frequency;

revising the control voltage provided to the voltage controlled oscillator based on an error associated with the frequency adjusted local reference frequency, based on the received reference frequency and based on the adjusted loop gain;

detecting a change in sign of the error associated with the frequency adjusted local reference frequency; and decreasing the loop gain value if a change in the sign of the error is detected.

5. A method according to claim 4, wherein said step of decreasing the loop gain decreases the loop gain by about a factor of two.

6. A method according to claim 4, wherein the step of decreasing the loop gain decreases the loop gain if the loop gain is greater than a minimum loop gain value.

7. A method according to claim 6, further comprising the step of setting the minimum loop gain value based on the determined operating frequency.

8. A method of synchronizing a voltage controlled oscillator which provides a local reference frequency in a wireless device to a received reference frequency, wherein the wireless device operates in at least two frequency bands, the method comprising the steps of:

determining the frequency band of operation of the wireless device;

adjusting a loop gain value based on the determined frequency band of operation of the wireless device;

providing a control voltage to the voltage controlled oscillator based on the determined frequency band of operation of the wireless device so as to provide a frequency adjusted local reference frequency;

revising the control voltage provided to the voltage controlled oscillator based on an error associated with the frequency adjusted local reference frequency, based on the received reference frequency and based on the adjusted loop gain wherein said step of revising the control voltage is carried out by a subroutine stored in a memory at a location associated with an interrupt vector;

detecting a change in sign of the error associated with the frequency adjusted local reference frequency; and revising the location associated with the interrupt vector to a memory location associated with a subroutine utilizing a decreased loop gain if a change in the sign of the error is detected.

9. A method according to claim 8, wherein a plurality of subroutines is provided for each of said at least two operating frequency bands, and wherein said step of revising the location associated with the interrupt vector revises the location of the interrupt vector utilizing the memory locations associated with the plurality of subroutines for the operating frequency of the wireless device.

10. A method according to claim 8, wherein a plurality of subroutines are provided for said at least two operating frequency bands, said method further comprising the step of adjusting parameters of the subroutines based on the determined operating frequency band of the wireless device.

11. A method according to claim 10, wherein the step of adjusting parameters of the subroutines comprises multiplying a loop gain of a subroutine by a ratio of the at least two operating frequency bands.

12. A method of synchronizing a voltage controlled oscillator which provides a local reference frequency in a wireless device to a received reference frequency, wherein the wireless device operates in at least two frequency bands, the method comprising the steps of:

determining the frequency band of operation of the wireless device;

adjusting a loop gain value based on the determined frequency band of operation of the wireless device;

providing a control voltage to the voltage controlled oscillator based on the determined frequency band of operation of the wireless device so as to provide a frequency adjusted local reference frequency;

revising the control voltage provided to the voltage controlled oscillator based on an error associated with the frequency adjusted local reference frequency, based on the received reference frequency and based on the adjusted loop gain; and increasing the control voltage to provide an initial control voltage greater than the control voltage corresponding to the operating frequency.

13. A method of temperature compensating a local reference frequency in a wireless device to a received reference frequency, the method comprising the steps of:

initiating a table of temperature compensation values which compensate the local reference frequency for temperature, wherein the temperature compensation values have associated with them an indicator of accuracy which indicates an accuracy of determination of a corresponding temperature compensation value;

measuring a temperature of the wireless device;

adjusting the local reference frequency of the wireless device initially based on one of said temperature compensation values associated with the temperature of the wireless device, and refining the adjustment based on the received reference frequency;

determining the mean frequency adjustment of the local reference frequency;

determining a received accuracy indicator associated with the received reference frequency which indicates an accuracy of a source of the received reference frequency;

comparing the received accuracy indicator with the indicator of accuracy associated with said temperature compensation value associated with the temperature of the wireless device so as to provide a relative accuracy comparison; and updating the table of temperature compensation values based on the relative accuracy comparison.

14. A method according to claim 13, wherein the table of temperature compensation values is not updated if the relative accuracy comparison indicates that the received accuracy indicator is inferior to the indicator of accuracy associated with the temperature compensation value associated with the temperature of the wireless device.

15. A method according to claim 13, wherein the updating step updates the table of temperature compensation values with the determined mean frequency adjustment if the relative accuracy comparison indicates that the received accuracy indicator is superior to the indicator of accuracy associated with the temperature compensation value associated with the temperature of the wireless device.

16. A method according to claim 15, further comprising the step of updating the indicator of accuracy associated with the updated temperature compensation value with the received accuracy indicator.

17. A method according to claim 13 wherein the updating step updates the table of temperature compensation values by adjusting the temperature compensation value towards the determined mean frequency adjustment if the relative accuracy comparison indicates that the received accuracy indicator is equivalent to the indicator of accuracy associated with the temperature compensation value associated with the temperature of the wireless device.

18. A method according to claim 13, wherein the table of temperature compensation values is not updated if the mean frequency adjustment exceeds a threshold value associated with the received reference frequency.

19. A method of accelerating frequency lock in a wireless device when a hand over from a first base station operating at a first frequency to a second base station operating at a second frequency occurs, the method comprising the steps of:

selecting a high initial loop gain of an automatic frequency control loop associated with a voltage controlled oscillator of the wireless device, wherein the voltage controlled oscillator provides a local reference frequency for the wireless device;

measuring the frequency error between the local reference frequency generated utilizing the high initial loop gain value and a received reference frequency from the second base station;

detecting that the measured frequency error has changed sign; and progressively reducing the loop gain of the automatic frequency control loop responsive to detected changes in sign until a minimum loop gain associated with the second frequency of operation of the second base station is achieved, wherein the minimum loop gain associated with the second frequency of operation is different from the minimum loop gain associated with the first frequency of operation.

20. A method according to claim 19, wherein the step of progressively reducing the loop gain comprises the steps of:

providing a set of predefined loop gains; and selecting the next lower loop gain in the set of predefined loop gains when a sign change is detected.

21. A method according to claim 20, wherein each of the set of predefined loop gains has associated with it a subroutine and wherein said step of selecting the next lower loop gain comprises the step of selecting the subroutine associated with the next lower loop gain.

22. A method according to claim 21, wherein said predefined set of loop gains comprises loop gains which decrease by a factor of two.

23. A system for synchronizing a voltage controlled oscillator which provides a local reference frequency in a wireless device to a received reference frequency, wherein the wireless device operates in at least two frequency bands, the system comprising:

means for determining the frequency band of operation of the wireless device;

means for adjusting a loop gain value based on the determined frequency band of operation of the wireless device;

means for providing a control voltage to the voltage controlled oscillator based on the determined frequency band of operation of the wireless device so as to provide a frequency adjusted local reference frequency;

means for revising the control voltage provided to the voltage controlled oscillator based on an error associated with the frequency adjusted local reference frequency, based on the received reference frequency and based on the adjusted loop gain; and means for compensating the loop gain based on an operating temperature of the wireless device.

24. A system according to claim 23, wherein the means for compensating the loop gain comprises:

means for determining the operating temperature of the wireless device;

means for obtaining a loop gain compensating value from a table of temperature compensation values containing multiplier values selected so as to maintain substantially constant loop gain with variation in temperature; and means for compensating the loop gain utilizing the obtained loop gain compensating value.

25. A system according to claim 24, wherein the multiplier values are linearly decreasing with temperature.

26. A system for synchronizing a voltage controlled oscillator which provides a local reference frequency in a wireless device to a received reference frequency, wherein the wireless device operates in at least two frequency bands, the system comprising:

means for determining the frequency band of operation of the wireless device;

means for adjusting a loop gain value based on the determined frequency band of operation of the wireless device;

means for providing a control voltage to the voltage controlled oscillator based on the determined frequency band of operation of the wireless device so as to provide a frequency adjusted local reference frequency; and means for revising the control voltage provided to the voltage controlled oscillator based on an error associated with the frequency adjusted local reference frequency, based on the received reference frequency and based on the adjusted loop gain;

means for detecting a change in sign of the error associated with the frequency adjusted local reference frequency; and means for decreasing the loop gain value if a change in the sign of the error is detected.

27. A system according to claim 26, wherein said means for decreasing the loop gain decreases the loop gain by about a factor of two.

28. A system according to claim 26, wherein the means for decreasing the loop gain decreases the loop gain if the loop gain is greater than a minimum loop gain value.

29. A system according to claim 28, further comprising means for setting the minimum loop gain value based on the determined operating frequency.

30. A system for synchronizing a voltage controlled oscillator which provides a local reference frequency in a wireless device to a received reference frequency, wherein the wireless device operates in at least two frequency bands, the system comprising:

means for determining the frequency band of operation of the wireless device;

means for adjusting a loop gain value based on the determined frequency band of operation of the wireless device;

means for providing a control voltage to the voltage controlled oscillator based on the determined frequency band of operation of the wireless device so as to provide a frequency adjusted local reference frequency;

means for revising the control voltage provided to the voltage controlled oscillator based on an error associated with the frequency adjusted local reference frequency, based on the received reference frequency and based on the adjusted loop gain, wherein said means for revising the control voltage is carried out by a subroutine stored in a memory at a location associated with an interrupt vector;

means for detecting a change in sign of the error associated with the frequency adjusted local reference frequency; and means for revising the location associated with the interrupt vector to a memory location associated with a subroutine utilizing a decreased loop gain if a change in the sign of the error is detected.

31. A system according to claim 30, wherein a plurality of subroutines is provided for each of said at least two frequency bands, and wherein said means for revising the location associated with the interrupt vector revises the location of the interrupt vector utilizing the memory locations associated with the plurality of subroutines for the operating frequency band of the wireless device.

32. A system according to claim 30, wherein a plurality of subroutines are provided for said at least two operating frequency bands, said system further comprising means for adjusting parameters of the subroutines based on the determined operating frequency band of the wireless device.

33. A system according to claim 32, wherein the means for adjusting parameters of the subroutines comprises means for multiplying a loop gain of a subroutine by a ratio of the at least two operating frequency bands.

34. A system for synchronizing a voltage controlled oscillator which provides a local reference frequency in a wireless device to a received reference frequency, wherein the wireless device operates in at least two frequency bands, the system comprising:

means for determining the frequency band of operation of the wireless device;

means for adjusting a loop rain value based on the determined frequency band of operation of the wireless device;

means for providing a control voltage to the voltage controlled oscillator based on the determined frequency band of operation of the wireless device so as to provide a frequency adjusted local reference frequency; and means for revising the control voltage provided to the voltage controlled oscillator based on an error associated with the frequency adjusted local reference frequency, based on the received reference frequency and based on the adjusted loop gain; and means for increasing the control voltage to provide an initial control voltage greater than the control voltage corresponding to the operating frequency.

35. A system for temperature compensating a local reference frequency in a wireless device to be synchronized to a received reference frequency, the system comprising:

means for initiating a table of temperature compensation values which compensate the local reference frequency for temperature, wherein the initial temperature compensation values have associated with them an initial indicator of accuracy which indicates an accuracy of determination of a corresponding temperature compensation value;

means for measuring a temperature of the wireless device;

means for adjusting the local reference frequency of the wireless device initially based on one of said temperature compensation value associated with the temperature of the wireless device, and for refining the adjustment based on said received reference value;

means for determining the mean frequency adjustment of the local reference frequency;

means for determining a received accuracy indicator associated with the received reference frequency which indicates an accuracy of a source of the received reference frequency;

means for comparing the received accuracy indicator with the indicator of accuracy associated with the temperature compensation value associated with the temperature of the wireless device so as to provide a relative accuracy comparison; and means for updating the table of temperature compensation values based on the relative accuracy comparison.

36. A system according to claim 35, wherein the table of temperature compensation values is not updated if the relative accuracy comparison indicates that the received accuracy indicator is inferior to the indicator of accuracy associated with the temperature compensation value associated with the temperature of the wireless device.

37. A system according to claim 35, wherein the means for updating comprises means for updating the table of temperature compensation values with the determined mean frequency adjustment if the relative accuracy comparison indicates that the received accuracy indicator is superior to the indicator of accuracy associated with the temperature compensation value associated with the temperature of the wireless device.

38. A system according to claim 37, further comprising means for updating the indicator of accuracy associated with the updated temperature compensation value with the received accuracy indicator.

39. A system according to claim 35 wherein the means for updating comprises means for updating the table of temperature compensation values by adjusting the temperature compensation value towards the determined mean frequency adjustment if the relative accuracy comparison indicates that the received accuracy indicator is equivalent to the indicator of accuracy associated with the temperature compensation value associated with the temperature of the wireless device.

40. A system according to claim 35, wherein the table of temperature compensation values is not updated if the mean frequency adjustment exceeds a threshold value associated with the received reference frequency.

41. A system for accelerating frequency lock in a wireless device when a hand over from a first base station operating at a first frequency to a second base station operating at a second frequency occurs, comprising:

means for selecting a high initial loop gain of an automatic frequency control loop associated with a voltage controlled oscillator of the wireless device, wherein the voltage controlled oscillator provides a local reference frequency for the wireless device;

means for measuring the frequency error between the local reference frequency and a received reference frequency from the second base station;

means for detecting that the measured frequency error has changed sign; and means for progressively reducing the loop gain of the automatic frequency control loop responsive to detected changes in sign until a minimum loop gain associated with the second frequency of operation of the second base station is achieved, wherein the minimum loop gain associated with the second frequency of operation is different from the minimum loop gain associated with the first frequency of operation.

42. A system according to claim 41, wherein the means for progressively reducing the loop gain comprises:

means for providing a set of predefined loop gains; and means for selecting the next lower loop gain in the set of predefined loop gains when a sign change is detected.

43. A system according to claim 42, wherein each of the set of predefined loop gains has associated with it a subroutine and wherein said means for selecting the next lower loop gain comprises means for selecting the subroutine associated with the next lower loop gain.

44. A system according to claim 43, wherein said predefined set of loop gains comprises loop gains which decrease by a factor of two.

* * * * *

UNITED STATES PATENT AND TRADEMARK OFFICE
CERTIFICATE OF CORRECTION

PATENT NO. : 6,278,867 B1
DATED : August 21, 2001
INVENTOR(S) : Northcutt et al.

Page 1 of 1

It is certified that error appears in the above-identified patent and that said Letters Patent is hereby corrected as shown below:

Column 20,
Line 1, should read as follows:
-- means for adjusting a loop gain value based on the --

Signed and Sealed this

Seventh Day of May, 2002

Attest:

Attesting Officer

JAMES E. ROGAN
Director of the United States Patent and Trademark Office